United States Patent
Jang et al.

(10) Patent No.: US 10,511,060 B2
(45) Date of Patent: Dec. 17, 2019

(54) ENCODING METHOD AND DEVICE USING RATE-COMPATIBLE, LOW-DENSITY PARITY-CHECK CODE IN COMMUNICATION SYSTEM

(71) Applicant: Samsung Electronics Co., Ltd., Suwon-si, Gyeonggi-do (KR)

(72) Inventors: Min Jang, Seongnam-si (KR); Seok-Ki Ahn, Suwon-si (KR); Chi-Woo Lim, Suwon-si (KR); Jae-Yoel Kim, Seongnam-si (KR); Woo-Myoung Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 426 days.

(21) Appl. No.: 15/505,456

(22) PCT Filed: Jun. 17, 2016

(86) PCT No.: PCT/KR2016/006492
§ 371 (c)(1),
(2) Date: Feb. 21, 2017

(87) PCT Pub. No.: WO2016/204578
PCT Pub. Date: Dec. 22, 2016

(65) Prior Publication Data
US 2017/0271718 A1 Sep. 21, 2017

Related U.S. Application Data

(60) Provisional application No. 62/181,435, filed on Jun. 18, 2015.

(51) Int. Cl.
*H01M 10/38* (2006.01)
*H03M 13/11* (2006.01)
*H04L 1/00* (2006.01)

(52) U.S. Cl.
CPC ....... *H01M 10/38* (2013.01); *H03M 13/1102* (2013.01); *H04L 1/0063* (2013.01)

(58) Field of Classification Search
CPC .......... H03M 13/1102; H03M 13/118; H03M 13/618; H03M 13/6393; H04L 1/00; H04L 1/0063
See application file for complete search history.

(56) References Cited

U.S. PATENT DOCUMENTS 8,239,746 B2   8/2012  Divsalar et al.
2007/0022362 A1  1/2007  Yue et al.
(Continued)

FOREIGN PATENT DOCUMENTS

KR   10-2007-0119580 A   12/2007
KR   10-2013-0135746 A   12/2013

OTHER PUBLICATIONS

Tsung-Yi Chen et al., Protograph-Based Raptor-Like LDPC Codes, pp. 1-12, Mar. 9, 2014.

*Primary Examiner* — David B Lugo
(74) *Attorney, Agent, or Firm* — Jefferson IP Law, LLP (57) ABSTRACT

A 5th generation (5G) or pre-5G communication system for supporting a data transmission rate higher than that of a 4th generation (4G) communication system such as long term evolution (LTE) is disclosed. The present disclosure relates to a rate compatible low-density parity-check (RC-LDPC) encoding method and device therefor. The encoding method includes using LDPC in a communication system, including the operations of LDPC encoding information bits by a first encoding rate, and performing a concatenated single parity check (SPC) encoding for the encoded bits by at least one second encoding rate lower than the first encoding rate.

10 Claims, 8 Drawing Sheets

(56) References Cited

U.S. PATENT DOCUMENTS

| | | |
|---|---|---|
| 2008/0028273 A1 | 1/2008 | Jeong et al. |
| 2008/0072122 A1* | 3/2008 | Nimbalker ........... H03M 13/114 714/774 |
| 2008/0155385 A1 | 6/2008 | Jeong et al. |
| 2008/0263431 A1 | 10/2008 | Jeong et al. |
| 2014/0157079 A1 | 6/2014 | Park et al. |
| 2015/0039964 A1* | 2/2015 | Fonseka ............. H03M 13/253 714/756 |

* cited by examiner

ENCODING METHOD AND DEVICE USING RATE-COMPATIBLE, LOW-DENSITY PARITY-CHECK CODE IN COMMUNICATION SYSTEM

CROSS-REFERENCE TO RELATED APPLICATION(S)

This application is a U.S. National Stage application under 35 U.S.C. § 371 of an International application filed on Jun. 17, 2016 and assigned application number PCT/KR2016/006492, which claimed the benefit of a U.S. Provisional application filed on Jun. 18, 2015 in the U.S. Patent and Trademark Office and assigned Ser. No. 62/181,435, the entire disclosure of each of which is hereby incorporated by reference.

TECHNICAL FIELD

The present disclosure relates to an encoding method and apparatus using a low-density parity-check (LDPC) in a communication system. More particularly, the present disclosure relates to a rate compatible (RC) LDPC (RC-LDPC) encoding method and apparatus.

BACKGROUND

In order to meet wireless data traffic demands that have increased after 4th generation (4G) communication system commercialization, efforts to develop an improved 5th generation (5G) communication system or a pre-5G communication system have been made. For this reason, the 5G communication system or the pre-5G communication system is called a beyond 4G network communication system or a post long term evolution (LTE) system.

In order to achieve a high data transmission rate, an implementation of the 5G communication system in a mmWave band (for example, 60 GHz band) is being considered. In the 5G communication system, technologies such as beamforming, massive multiple-input multiple-output (MIMO), full dimensional MIMO (FD-MIMO), an array antenna, analog beam-forming, and a large scale antenna are discussed to mitigate a propagation path loss in the mmWave band and increase a propagation transmission distance.

Further, technologies such as an evolved small cell, an advanced small cell, a cloud radio access network (cloud RAN), an ultra-dense network, device to device communication (D2D), a wireless backhaul, a moving network, cooperative communication, coordinated multi-points (CoMP), and interference cancellation have been developed to improve the system network in the 5G communication system.

In addition, the 5G system has developed advanced coding modulation (ACM) schemes such as hybrid frequency shift keying (FSK) and quadrature amplitude modulation (QAM) modulation (FQAM) and sliding window superposition coding (SWSC), and advanced access technologies such as filter bank multi carrier (FBMC), non orthogonal multiple access (NOMA), and sparse code multiple access (SCMA).

Further, various communication systems including a wired or wireless communication system use a low-density parity-check (LDPC) encoding scheme as a channel coding scheme. An LDPC code corresponds to an error correction code that has practically implementable encoding/decoding complexity and a capability close to a channel capacity which is a theoretical communication limit. The LDPC code may be designed to have a structure suitable for parallel processing and is applied and used for various communication systems such as Institute of Electrical and Electronics Engineers (IEEE) 802.11n/ad Wi-Fi, IEEE 802.16e WiMAX, digital video broadcasting (DVB)-S2/T2/C2 corresponding to a digital broadcasting standard, Advanced Television Systems Committee (ATSC) 3.0, and home network G.hn due to an excellent error correction capability on various actual channels.

As it is well known, a binary LDPC code is defined by a parity-check matrix consisting of elements 0 and 1. When it is assumed that numbers of rows and columns of the parity-check matrix are N and M, respectively, an LDPC encoding scheme using the parity-check matrix receives message bits (information bits) having a length of K=N−M and generates a codeword (encoding bits or bits of a encoding block) having a length N.

The LDPC code is classified as one type of a block code. The block code is designed to support one predetermined code rate and controls the code rate through the use of puncturing as necessary. However, when the code rate is controlled simply through the use of puncturing, there is a disadvantage in that the performance significantly deteriorates compared to the code designed to be suitable for the corresponding code rate. Accordingly, in order to support various code rates with excellent performance in a communication system, designing and using different LDPC codes according to the code rates to be supported may be the simplest solution method. However, storing and using all the LDPC code(s) corresponding to a number of the code rate(s) to be supported creates a big burden in hardware to both a transmitter and a receiver in the communication system.

To solve the problem, research on an rate compatible (RC) LDPC (RC-LDPC) has been conducted by many research groups. An RC-LDPC encoding is one type of LDCP encoding schemes that may effectively support an encoding of various code rates through one encoding structure. In the encoding scheme based on the RC-LDPC, LDPC codes of various code rates may be effectively generated through puncturing and, organically, incremental redundancy (IR) hybrid automatic repeat and request (HARQ) (IR-HARQ) may be supported.

In the conventional RC-LDPC encoding scheme, a high code rate LDPC code part and a low code rate LDPC code part are designed to be concatenated. Further, the low code rate LDPC code part is designed in consideration of supporting of code rate-compatibility. The RC-LDPC code extension method according to the related art is largely divided into a diagonal extension scheme and a general extension scheme according to a scheme of generating parity bits of the low code rate LDPC code part. For example, the general extension scheme includes a lower triangular extension scheme.

Figure 1:
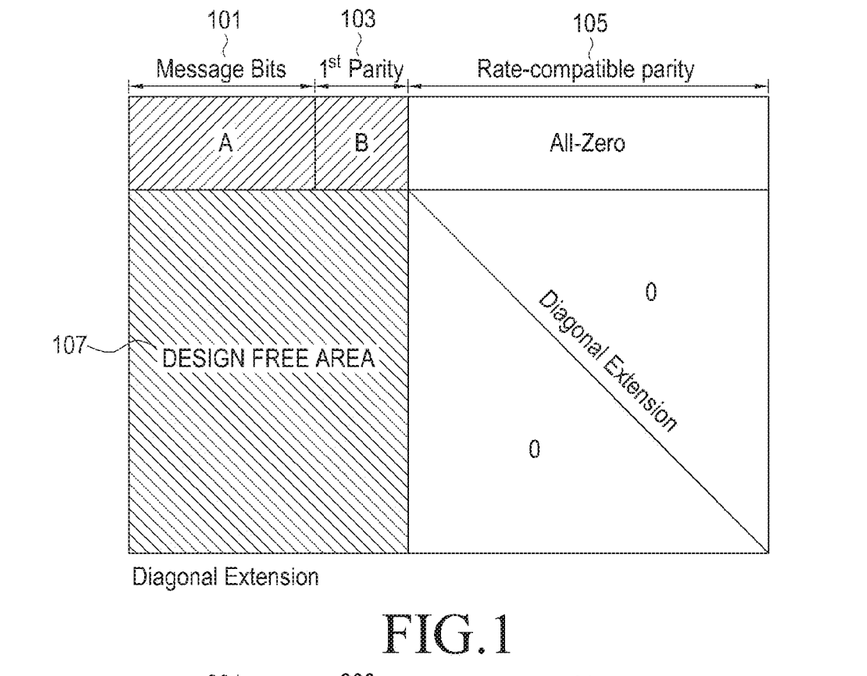
FIG. 1 illustrates a structure of a parity check matrix of an rate compatible low-density parity-check (RC-LDPC) code designed through a diagonal extension used in the RC-LDPC encoding scheme according to the related art.

FIG. 1 illustrates a structure of a parity check matrix of an RC-LDPC code designed through a diagonal extension used in the RC-LDPC encoding scheme according to the related art.

Referring to FIG. 1, a reference numeral 101 indicates an information area of message bits corresponding to information bits, a reference numeral 103 indicates a first parity bit area of first parity bits for information bits, and a reference numeral 105 indicates a second parity area of second parity bits for information bits. In FIG. 1, "A" indicates a sub-matrix for the information bits, and "B" indicates a sub-matrix for the first parity bits. Further, a reference numeral 107 indicates a design free area in which "1" can exist in the parity check matrix. As illustrated in FIG. 1, in the parity check matrix of the RC-LDPC code designed through the diagonal extension, the second parity bit area (reference numeral 105) corresponds to a rate-compatible parity area and is designed by a diagonal matrix. When the high-code rate parity check matrix of the RC-LDPC code is $H_0$, the parity check matrix $H_D$ of the RC-LDPC code designed through the diagonal extension may be expressed by Equation 1 below.

$$H_D = \begin{bmatrix} H_0 & 0 \\ B_D & I \end{bmatrix} \quad \text{Equation 1}$$

In Equation 1 above, I denotes a diagonal matrix and $B_D$ denotes a sub-matrix which may be configured in a general form. Further, 0 denotes a zero matrix. Since parts $H_0$, 0, and I are all fixed in $H_D$, optimization of $H_D$ may be achieved by optimization of the sub-matrix $B_D$. As described above, an encoding of the RC-LDPC code designed through the diagonal extension includes two concatenated encodings. First, a codeword is acquired through the encoding of the LDPC code defined as $H_0$. Further, a final codeword is acquired by receiving the codeword and performing a single parity-check (SPC) encoding defined as $[B_D;I]$. A transmitter punctures the remaining parity bits except for parity bits corresponding to transmission code rates in the codeword and transmits the codeword.

Figure 2:
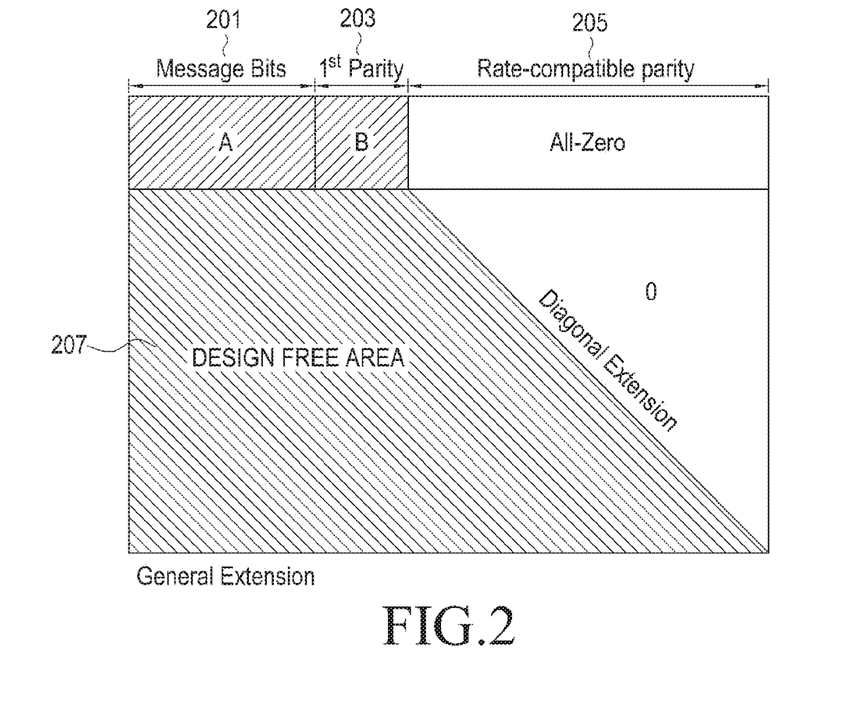
FIG. 2 illustrates a structure of a parity check matrix designed through a lower triangular extension used in the RC-LDPC encoding scheme according to the related art.

FIG. 2 illustrates a parity check matrix structure designed through a lower triangular extension used in the RC-LDPC encoding scheme according to the related art.

Referring to FIG. 2, a reference numeral 201 indicates an information area of message bits corresponding to information bits, a reference numeral 203 indicates a first parity bit area of first parity bits for information bits, and a reference numeral 205 indicates a second parity area of second parity bits for information bits. In FIG. 1, "A" indicates a sub-matrix for information bits, and "B" indicates a sub-matrix for the first parity bits. Further, a reference numeral 207 indicates a design free area in which "1" can exist in the parity check matrix. As illustrated in FIG. 2, in the parity check matrix of the RC-LDPC code designed through the general extension, the second parity bit area (reference numeral 205) corresponds to a rate-compatible parity area and the rate-compatible parity area is designed by a general lower triangular matrix. When the high-code rate parity check matrix of the RC-LDPC code is $H_0$, the parity check matrix $H_G$ of the RC-LDPC code designed through the general extension of FIG. 2 may be expressed by Equation 2 below.

$$H_G = \begin{bmatrix} H_0 & 0 \\ B_G & T \end{bmatrix} \quad \text{Equation 2}$$

In Equation 2 above, T denotes a lower triangular matrix and $B_G$ denotes a sub-matrix in the parity check matrix which may be configured in a general form. Since $H_0$ and 0 are fixed in $H_G$, designing to optimize $H_G$ is the same as designing to optimize $B_G$ and T. As described above, an encoding of the RC-LDPC code designed through the general extension may be implemented by two schemes.

In the two encoding schemes of the RC-LDPC code designed through the general extension, the first scheme calculates an inverse matrix of the matrix T and calculates matrix-multiplication. First, a codeword is acquired through an encoding of the LDPC code defined as $H_0$. A final codeword may be acquired by multiplying the codeword and $T^{-1}B_G$.

Figure 3:
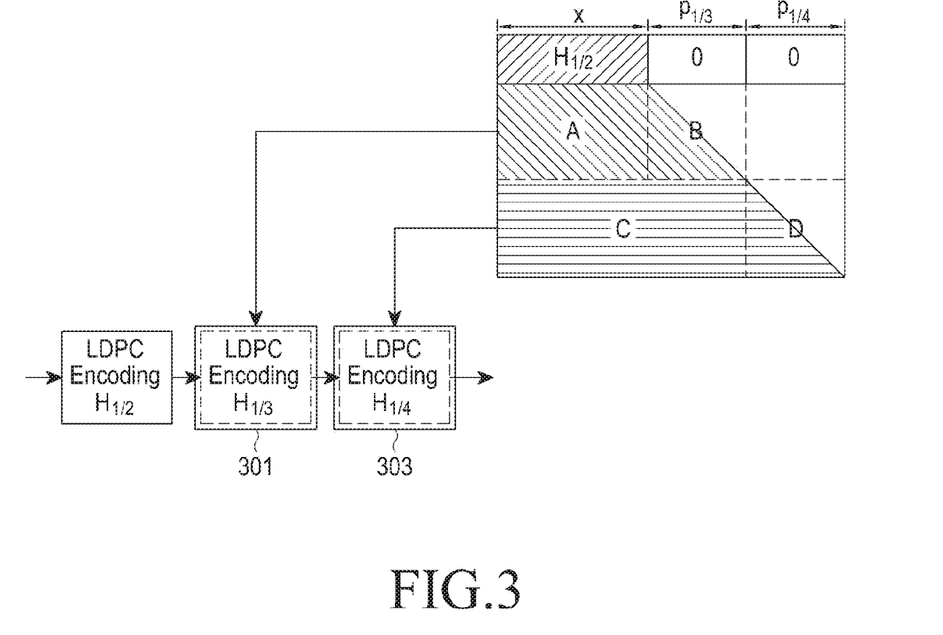
FIGS. 3 and 4 illustrate various encoding schemes of an RC-LDPC code designed through a general extension according to the related art.

FIG. 3 illustrates a procedure by the first scheme corresponding to an encoding process using matrix-multiplication of a general extension RC-LDPC code according to the related art. Based on the first scheme, for example, encodings 301 and 303 by two concatenated LDPC codes are performed.

Referring to FIG. 3, x briefly indicates an area including an information area and a first parity area, $p_{1/3}$ and $p_{1/4}$ indicate second parity areas, A, B, C, and D briefly indicate sub-matrixes of the parity check matrix, and subscripts 1/2, 1/3, and 1/4 indicate, for example, corresponding code rates.

The second scheme of the two encoding schemes of the RC-LDPC code designed through the general extension sequentially performs SPC encodings for all rows of the matrix T corresponding to the lower triangular matrix. First, a codeword is acquired through an encoding of the LDPC code defined as $H_0$. Then, SPC encodings are sequentially performed for the rows of the LDPC code defined by the matrix $[B_G;T]$. Accordingly, based on the second scheme, encodings of the LDPC code defined as $H_0$ and SPC codes corresponding to a number of rows of the matrix $[B_G;T]$, which are concatenated, are performed.

Figure 4:
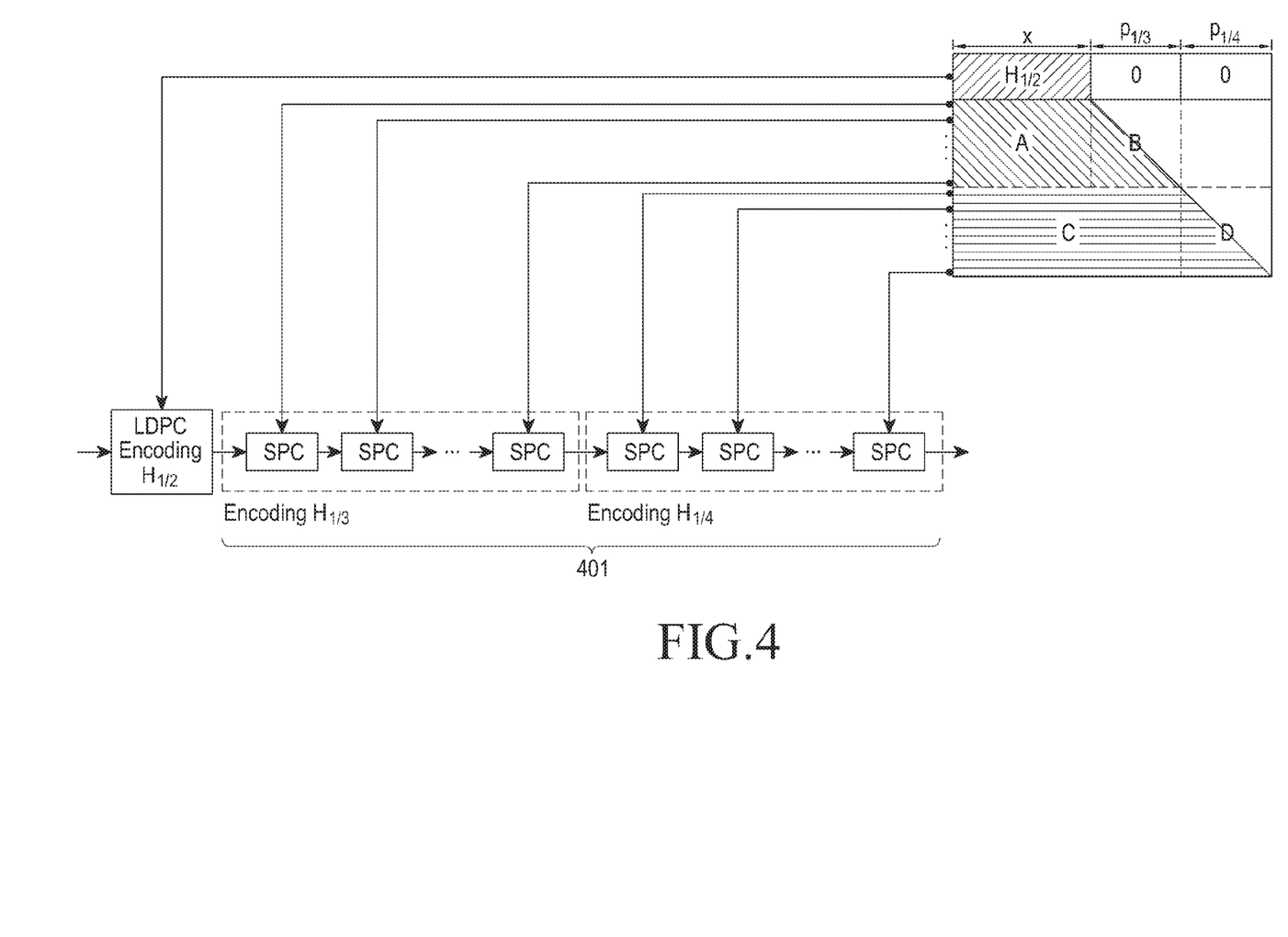

FIG. 4 illustrates an encoding process using concatenated SPC encodings of the general extension RC-LDPC code according to the related art. Meanings of the reference numerals of FIG. 4 are the same as those of FIG. 3 and a reference numeral 401 indicates the sequentially performed concatenated SPC encodings.

However, when the encoding and decoding scheme using the parity check matrix of the RC-LDPC code designed through the diagonal extension or the parity check matrix of the RC-LDPC code designed through the lower triangular extension is implemented, complexity for the encoding or the decoding may increase and thus a method of reducing the complexity is required.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide an encoding method and apparatus using an rate compatible low-density parity-check (RC-LDPC) code for reducing complexity in a communication system.

Another aspect of the present disclosure is to provide an encoding method and apparatus using an RC-LDPC code for improving performance while reducing complexity in a communication system.

Another aspect of the present disclosure is to provide a transmission apparatus and method using an RC-LDPC code which may reduce complexity in a communication system.

In accordance with an aspect of the present disclosure, A method of encoding using a rate-compatible low density parity check (LDPC) code in a communication system is provided. The method includes performing an LDPC encoding on information bits by a first code rate, and performing concatenated single parity check (SPC) encodings by at least one second code rate lower than the first code rate on the encoded information bits.

In accordance with an aspect of the present disclosure, A method of encoding using rate-compatible low density parity check (LDPC) code in a communication system is provided. The method includes performing an LDPC encoding on information bits by a first code rate, and performing at least one signal parity check (SPC) encoding corresponding to at least one second code rate lower than the first code rate on the encoded information bits.

In accordance with another aspect of the present disclosure, an encoding apparatus using a rate-compatible low density parity check (LDPC) code in a communication system is provided. The apparatus includes a first encoder configured to perform an LDPC encoding on information bits by a first code rate, and at least one second encoder configured to perform concatenated single parity check (SPC) encodings by at least one second code rate lower than the first code rate on the encoded bits.

In accordance with another aspect of the present disclosure, an encoding apparatus using a rate-compatible low density parity check (LDPC) code in a communication system is provided. The apparatus includes a first encoder configured to perform an LDPC encoding on information bits by a first code rate, and at least one second encoder configured to perform at least one SPC encoding corresponding to at least one second code rate lower than the first code rate on the encoded information bits.

In accordance with another aspect of the present disclosure, a transmission apparatus in a communication system is provided. The apparatus includes a transmitter configured to transmit data, and at least one encoding processor configured to perform an encoding by using a rate-compatible low density parity check (LDPC) code, wherein the at least one encoding processor includes a first encoder that performs an LDPC encoding by a first code rate on the encoded information bits, and at least one second encoder that performs concatenated SPC encodings by at least one second code rate lower than the first code rate on the encoded information bits, and wherein the concatenated SPC encodings by the at least one second code rate are performed using a parity check matrix having a stair-wise lower triangular structure in an extension part.

In accordance with another aspect of the present disclosure, a transmission apparatus in a communication system is provided. The apparatus includes a transmitter configured to transmit data, and at least one encoding processor configured to perform an encoding by using a rate-compatible low density parity check (LDPC) code, wherein the at least one encoding processor includes a first encoder that performs an LDPC encoder on information bits by a first code rate, and at least one second encoder that performs at least one SPC encoding corresponding to at least one second code rate lower than the first code rate on the encoded information bits, and wherein the SPC encoding corresponding to the at least one second code rate are performed using a parity check matrix having a partial dual diagonal structure in an extension part.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

The present disclosure proposes a new structure of a parity check matrix of an rate compatible low-density parity-check (RC-LDPC) code which may reduce complexity while maintaining or improving error correction performance. According to an encoding method and apparatus to which the parity check matrix of the RC-LDPC code is applied according to an embodiment of the present disclosure, it is possible to resolve high complexity of the parity check matrix and a time delay caused when the RC-LDPC code is designed through the diagonal extension scheme or the general extension scheme described in the background art.

First, a problem of the RC-LDPC code designed through the diagonal extension scheme or the general extension scheme will be described in detail to help understanding of the present disclosure. Recognition of the problem motivates the various proposed embodiments of the present disclosure.

Figure 5:
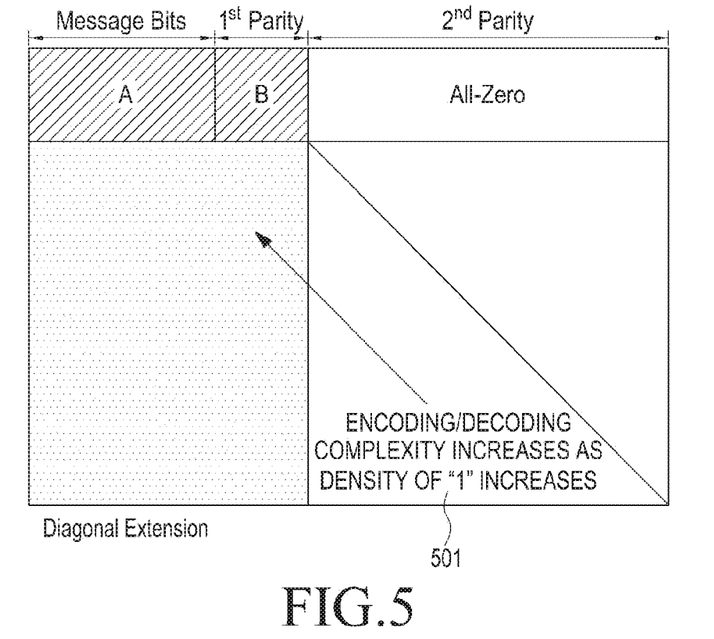
FIG. 5 illustrates decoding complexity of a parity check matrix of an RC-LDPC code designed through a diagonal extension scheme according to an embodiment of the present disclosure.

FIG. 5 illustrates decoding complexity of the parity check matrix of the RC-LDPC code designed through the diagonal extension scheme according to an embodiment of the present disclosure, and a structure of the parity check matrix by the diagonal extension scheme is the same as illustrated in FIG. 1.

Referring to FIG. 5, through the diagonal extension scheme, an RC-LDPC code supporting a simple encoding may be designed. However, when the RC-LDPC code is designed to be optimized in consideration of the diagonal extension scheme, the density of $H_0$ in the parity check matrix $H_D$ and 1 in matrix B is significantly higher than the density of 1 of the RC-LDPC code designed in consideration of the general extension scheme as illustrated in a reference numeral 501 of FIG. 5. Decoding complexity of the LDPC code is proportional to the density of 1 in the parity check matrix and, accordingly, using the RC-LDPC code designed through the diagonal extension scheme increases the decoding complexity.

Figure 6:
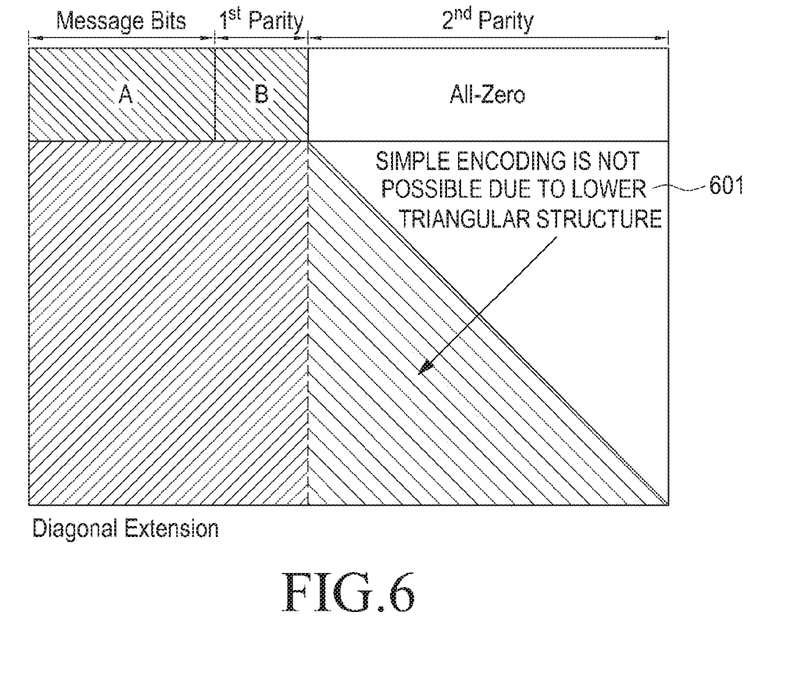
FIG. 6 illustrates encoding complexity of a parity check matrix of an RC-LDPC code designed through a general extension scheme according to an embodiment of the present disclosure.

FIG. 6 illustrates encoding complexity of the parity check matrix of the RC-LDPC code designed through the general extension scheme according to an embodiment of the present disclosure, and a structure of the parity check matrix by the general extension scheme is the same as the structure of the parity check matrix by the lower triangular extension scheme in the example of FIG. 1. In FIG. 6, reference numeral 601 denote a part in which simple encoding is not possible due to the lower triangular structure.

Referring to FIG. 6, the general extension scheme may reduce the density of $H_0$ in Equation 1 above and 1 in the matrix $B_D$ compared to the diagonal extension scheme and, accordingly, support a decoding having low complexity. However, when the RC-LDPC code is designed through the general extension scheme, the lower triangular matrix T in Equation 2 is designed without any restriction and, in this case, an operation amount increases according to calculation of an inverse matrix and performance of a matrix-multiplication operation. Accordingly, when the general extension scheme is used, a relatively more complex encoding must be performed. Compared to the concatenated SPC encodings through the diagonal extension scheme, the concatenated LDPC encodings and multiple concatenated SPC encodings through the general extension scheme are more complex and also have a higher delay time.

As described above, between the diagonal extension scheme and the general extension scheme, there is a trade-off relation between encoding complexity and decoding complexity.

Accordingly, embodiments of the present disclosure propose a method and an apparatus for overcoming an encoding/decoding complexity increase problem and designing and encoding an excellent RC-LDPC code in terms of performance-complexity trade-off.

Hereinafter, a structure of a new parity check matrix for the RC-LDPC code and an encoding method using the parity check matrix of the new structure will be described according to an embodiment of the present disclosure.

First, the parity check matrix for the RC-LDPC code according to the present disclosure has a structure including an extension part stair-wise designed in the unit of modulation and coding schemes (MCSs) to be supported or an extension part designed by a partial dual-diagonal component. Hereinafter, the parity check matrixes of the present disclosure according to the structure will be referred to as a parity check matrix having a stair-wise lower triangular structure and a parity check matrix having a partial dual-diagonal structure. The encoding method of the RC-LDPC code according to the present disclosure corresponds to a phased encoding method of the RC-LDPC code using a new parity check matrix of the two structures.

The parity check matrix having the lower triangular structure includes stair-wise sub-matrix (matrices) in the extension part for code rate compatibility, and the parity check matrix having the partial dual-diagonal structure includes sub-matrix (matrices) having a partial dual-diagonal component within a diagonal matrix. The form of the parity check matrix according to the present disclosure is fixed and the remaining extension parts of the parity check matrix are designed to be optimized.

Figure 7:
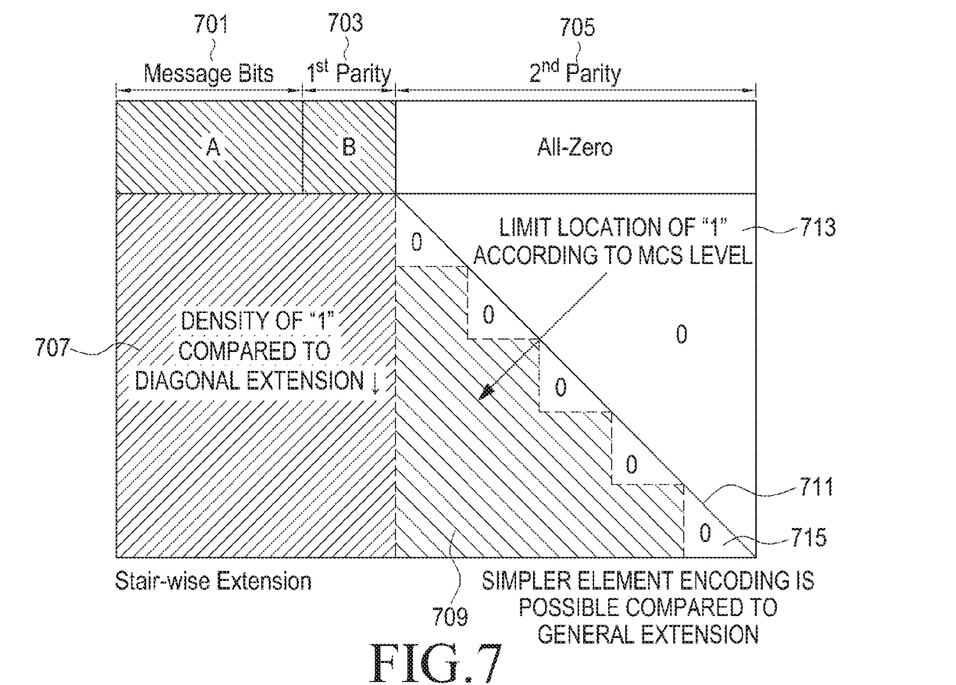
FIG. 7 illustrates an example of a structure of a parity check matrix having a stair-wise lower triangular structure in an extension part in the RC-LDPC encoding scheme according to an embodiment of the present disclosure.

FIG. 7 illustrates an example of a structure of a parity check matrix having a stair-wise lower triangular structure in an extension part in the RC-LDPC encoding scheme according to an embodiment of the present disclosure.

Referring to FIG. 7, a reference numeral 701 indicates an information area of message bits corresponding to information bits, a reference numeral 703 indicates a first parity bit area of first parity bits for information bits, and a reference numeral 705 indicates a second parity area of second parity bits for information bits and corresponds to an extension area (that is, the extension part) of the parity check matrix. In FIG. 7, "A" indicates a sub-matrix for information bits, and "B" indicates a sub-matrix for the first parity bits. Further, a reference numeral 707 indicates a design free area in which "1" can exist in the parity check matrix. As illustrated in FIG. 7, in the parity check matrix of the RC-LDPC code designed to have the stair-wise lower triangular structure in the extension part, the second parity bit area 705 corresponds to a rate-compatible parity area and is designed by a stair-wise diagonal matrix. In FIG. 7, a reference numeral 711 indicates a part in which "1" is located in the diagonal matrix, and reference numerals 713 and 715 indicate parts in which "0" is filled in the diagonal matrix.

In FIG. 7, a reference numeral 709 indicates a diagonal extension part having the stair-wise lower triangular structure, and the location of "1" is limited according to an MCS level in the diagonal extension part (reference numeral 709) unlike the design free area (reference numeral 707). Further, in the embodiment of FIG. 7, the parity check matrix may be understood as the parity check matrix having the lower triangular structure in which at least one area having a degree, which is not 1, is stair-wise configured according to a code rate in the extension part.

In FIG. 7, a stair-wise extension scheme of the parity check matrix is encoded according to each supported MCS unit (level or step). For example, when code rates of the LDPC code in the supported MCS are $r_0, r_1, r_2, \ldots$, and $r_{min}$ and a parity check matrix of the highest code rate is $H_0$, a parity check matrix of the code rate $r_1$ of the next MCS level is configured as Equation 3 below.

$$H_1 = \begin{bmatrix} H_0 & 0 \\ B_1 & I \end{bmatrix} \quad \text{Equation 3}$$

In Equation 3 above, $B_1$ corresponds to a sub-matrix designed for optimization by the code rate $r_1$. Further, the parity check matrix of the code rate $r_2$ of the next MCS level is configured as Equation 4 below.

$$H_2 = \begin{bmatrix} H_1 & 0 \\ B_2 & I \end{bmatrix} = \begin{bmatrix} H_0 & 0 & 0 \\ B_1 & I & 0 \\ B_{21} & B_{22} & I \end{bmatrix} \quad \text{Equation 4}$$

The matrix $B_2=[B_{21};B_{22}]$ corresponds to a sub-matrix designed for optimization by the code rate $r_2$ when a right side part is fixed. Through such a scheme, the parity check matrix can be extended according to each MCS level.

Figure 8:
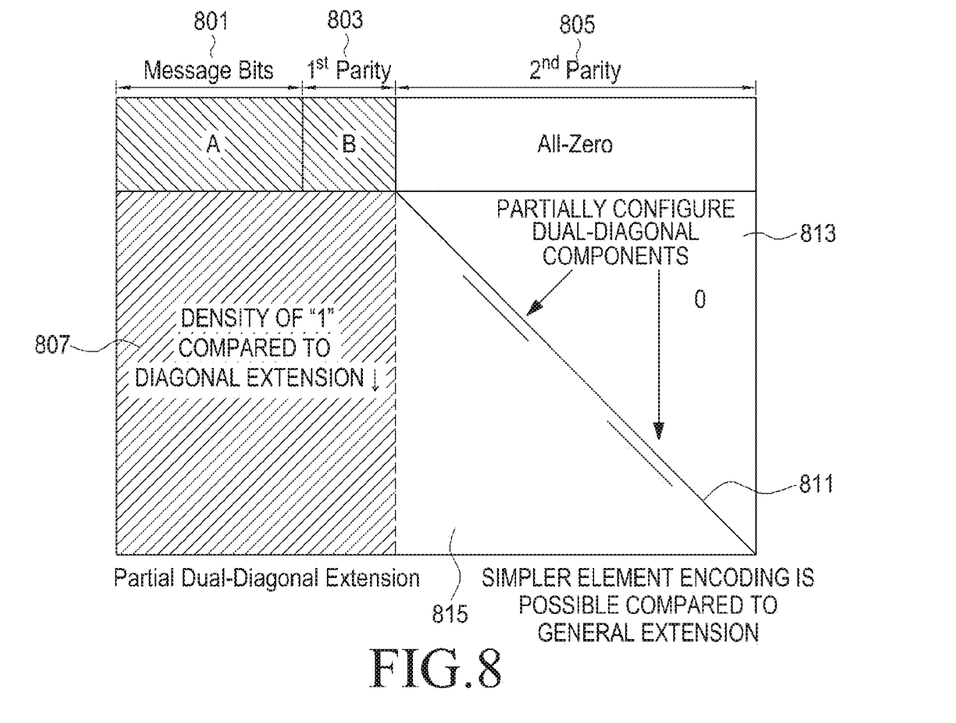
FIG. 8 illustrates an example of a structure of a parity check matrix having a partially dual diagonal structure in an extension part in the RC-LDPC encoding scheme according to an embodiment of the present disclosure.

FIG. 8 illustrates an example of a structure of a parity check matrix having a partially dual diagonal structure in an extension part in the RC-LDPC encoding scheme according to an embodiment of the present disclosure.

Referring to FIG. 8, a reference numeral 801 indicates an information area of message bits corresponding to information bits, a reference numeral 803 indicates a first parity bit area of first parity bits for information bits, and a reference numeral 805 indicates a second parity area of second parity bits for information bits and corresponds to an extension area (that is, the extension part) of the parity check matrix. In FIG. 8, "A" indicates a sub-matrix for information bits, and "B" indicates a sub-matrix for the first parity bits. Further, a reference numeral 807 indicates a design free area in which "1" can exist in the parity check matrix. As illustrated in FIG. 8, in the parity check matrix of the RC-LDPC code designed to have the partial dual diagonal structure in the extension part, the second parity bit area 805 corresponds to a rate-compatible parity area and is designed by a partial dual diagonal matrix. In FIG. 8, reference numerals 809 and 811 denote parts in which "1" is located in the dual diagonal matrix, and reference numerals 813 and 815 denote parts in which "0" is filled in the diagonal matrix.

In FIG. 8, an extension scheme of the parity check matrix is also executed according to each supported MCS unit (level or step). While the rate-compatible parity area of the newly extended part is fixed to the diagonal matrix in the conventional diagonal extension scheme, a dual diagonal component is partially configured in the partial dual diagonal extension scheme. For example, when code rates of the LDPC code in the supported MCS are $r_0, r_1, r_2, \ldots$, and $r_{min}$ and a parity check matrix of the highest code rate is $H_0$, a parity check matrix of the code rate $r_1$ of the next MCS level is configured as Equation 5 below.

$$H_1 = \begin{bmatrix} H_0 & 0 \\ B_1 & I'' \end{bmatrix} \quad \text{Equation 5}$$

In Equation 5 above, I" corresponds to a matrix generated by adding an additional diagonal component to the basic identity matrix, and a matrix $B_1$ corresponds to a sub-matrix designed for optimization by the code rate $r_1$. A parity check matrix of the code rate $r_2$ of the next MCS level is configured as Equation 6 below.

$$H_2 = \begin{bmatrix} H_0 & 0 & 0 \\ B_1 & I'' & 0 \\ B_2 & 0 & I'' \end{bmatrix} \quad \text{Equation 6}$$

A matrix $B_2$ corresponds to a sub-matrix designed for optimization when a right side part is fixed in the code rate $r_2$. Through such a scheme, the parity check matrix can be extended according to each MCS level.

In the embodiments of FIGS. 7 and 8, although the codes rates according to the MCS levels are illustrated up to $r_2$ for convenience of the description, lower code rates such as $r_0$, $r_1, r_2, \ldots$, and $r_{min}$ may be used.

In the embodiments of FIGS. 7 and 8, the sub-matrix (matrices) in the rate-compatible area are designed to be fixed to the stair-wise type or the partial dual diagonal type in the parity check matrix of the RC-LDPC code according to the present disclosure. By using the parity check matrix designed according to FIGS. 7 and 8, a density of "1" in the rate-compatible area corresponding to the extension part is higher than the density of "1" in the conventional diagonal extension scheme, but a parity check matrix having a particular structure may be designed unlike the conventional general extension scheme. As described above, when the rate-compatible area is fixed to the particular structure, first, it is possible to improve encoding/decoding complexity by reducing the density of "1" in design free areas (reference numerals 707 and 807) of the parity check matrix compared to the conventional diagonal extension scheme. Second, compared to the conventional general extension scheme, simpler encoders may be used (that is, concatenated SPC encoders in the unit of MCSs may be simply used), so that complexity of the encoding process can be reduced.

Figure 9:
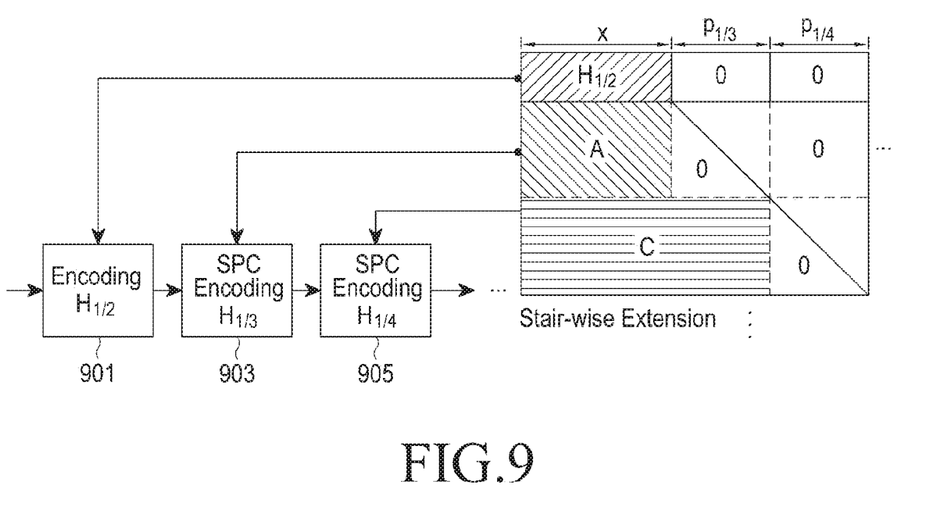
FIG. 9 illustrates an RC-LDPC encoding method using a parity check matrix having the stair-wise lower triangular structure according to an embodiment of the present disclosure.

FIG. 9 illustrates an RC-LDPC encoding method using a parity check matrix having a stair-wise lower triangular structure according to an embodiment of the present disclosure.

Figure 10:
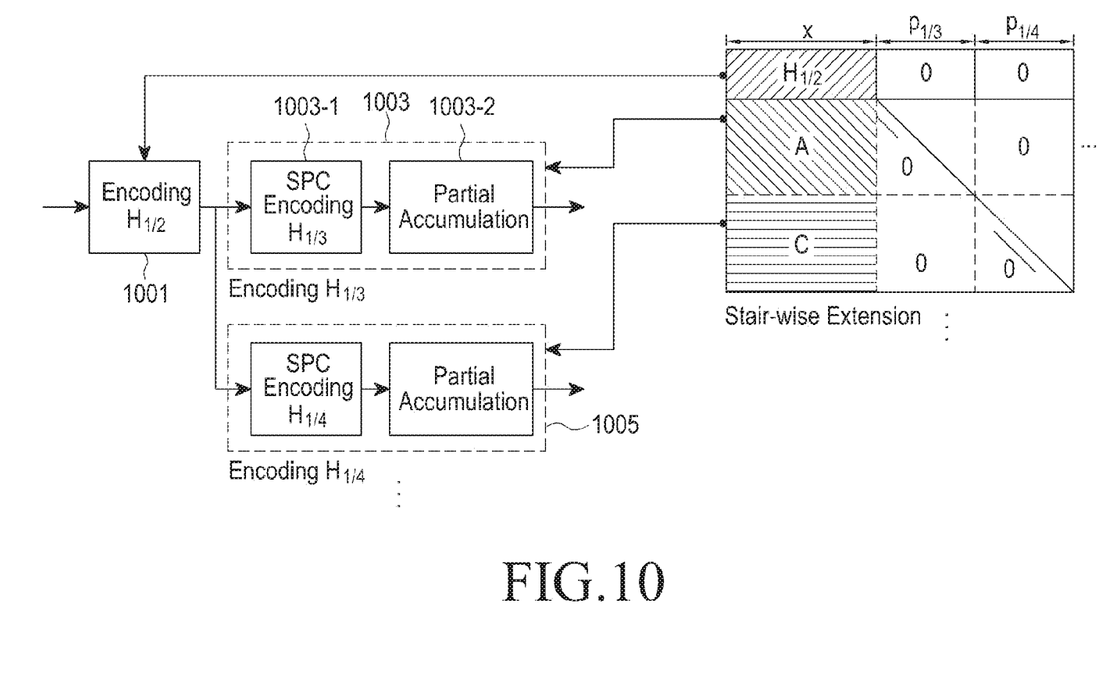
FIG. 10 illustrates an RC-LDPC encoding method using a parity check matrix having the partial dual diagonal structure according to an embodiment of the present disclosure.

Referring to FIG. 9, in the RC-LDPC encoding using the parity check matrix having the stair-wise lower triangular structure in the extension part, SPC encodings corresponding to a number of supported MCS units are concatenated and performed. First, an encoding for the highest code rate is performed on information bits in step 901. For an LDPC code of the highest code rate, a general LDPC encoding is performed. The SPC encoding is performed on a codeword acquired therethrough at a first MCS level in step 903. Since a diagonal extension is performed at each MCS level in a stair-wise extension, the SPC encoding may be performed at the next MCS level in step 905. The next level SPC encoding is sequentially performed on the acquired codeword, and a final codeword may be acquired through repetition of the above process. In FIGS. 9 and 10, x briefly indicates an area including an information area and a first parity area, $p_{1/3}$ and $p_{1/4}$ indicate second parity areas, A and C briefly indicate sub-matrixes of the parity check matrix, and subscripts 1/2, 1/3, and 1/4 indicate examples of corresponding code rates.

Similar to the configuration illustrated in FIG. 9, an encoding apparatus that performs the RC-LDPC encoding method of FIG. 9 may include a first encoder that performs an LDPC encoding on information bits by a first code rate and at least one second encoder that performs concatenated single parity check (SPC) encodings on the encoded bits by at least one second code rate lower than the first code rate.

FIG. 10 illustrates an RC-LDPC encoding method using a parity check matrix having a partial dual diagonal structure according to an embodiment of the present disclosure.

Referring to FIG. 10, in the RC-LDPC encoding using the parity check matrix having the partial dual diagonal structure in the extension part, SPC encodings corresponding to a number of supported MCS units are performed. First, an encoding for the highest code rate is performed on information bits in step 1001. For an LDPC code of the highest code rate, a general LDPC encoding is performed. A codeword acquired therethrough is encoded at a first MCS level in step 1003. Since a partial dual diagonal extension basically includes a diagonal component, the SPC encoding may be first performed in step 1003-1. Further, in the extension part, a partial accumulation is performed in consideration of a second diagonal component 1007 in step 1003-2. The partial accumulation refers to sequential accumulation of parity bits calculated through the SPC encoding in consideration of the second diagonal component. For example, when temporary parity bits generated based on the first diagonal component are p0', p1', p2', ... and there is the second diagonal component in parts corresponding to the parity bits, final parity bits may be calculated such as p0=p0', p1=p1'+p0, and p2=p2'+p1.

The next level SPC encoding is performed on the acquired codeword, in step 1005, and a final codeword may be acquired through repetition of the above process. Parity bits of each MCS level may be generated in parallel since there is no correlation therebetween. In an encoding process for each MCS level, the partial accumulation is performed when there is the second diagonal component in the corresponding MCS level, and is omitted when there is no second diagonal component in the corresponding MCS level.

Further, similar to the configuration illustrated in FIG. 10, an encoding apparatus that performs the RC-LDPC encoding method of FIG. 10 may include a first encoder that performs an LDPC encoding on information bits by a first code rate and at least one second encoder that performs at least one single parity check (SPC) encoding corresponding to at least one second code rate lower than the first code rate on the encoded bits. The encoding apparatus includes a partial accumulator that performs partial accumulation on the second diagonal component in the extension part after performing the SPC encoding.

A transmission apparatus that performs an encoding according to the encoding method of FIGS. 9 and 10 may include a transmitter for data transmission to the encoding apparatus of FIGS. 9 and 10 and further include a controller that controls the encoding operation and the transmission operation.

Meanwhile, in the above described embodiments of the present disclosure, the parity check matrix having the partial dual diagonal structure in the extension part and the parity check matrix having the dual diagonal structure in the extension may be applied to the RC-LDPC decoding method and apparatus in the same/similar way.

Table 1 below compares encoding/decoding complexity and performance of the RC-LDPC code between the prior art and the present disclosure.

As described above, the parity check matrix has a structure in which complexity of one of the encoding and the decoding is relatively high in the prior art. According to the present disclosure, in order to reduce the density of "1" in the parity check matrix, "1" is placed in the rate-compatible parity part of the parity check matrix, which is limited to be implementation-friendly. Accordingly, the encoding complexity and the decoding complexity can be relatively reduced according to the present disclosure.

TABLE 1

| Division | Design method | Encoding method | Encoding complexity order | Decoding complexity order | Limited length performance order |
|---|---|---|---|---|---|
| Prior art | General | (high code rate CLPC encoding) + (low code rate LDPC encoding or plurality of SPC encodings) | 4 (perform matrix-multiplication) | 1 | 1 |
| | Diagonal | (high code rate LDPC encoding) + (one SPC encoding) | 1 | 4 (PCM densification) | 4 (implementation performance) |
| Present disclosure | Stairwise | (high code rate LDPC encoding) + (phased SPC encodings) | 2 | 1 | 1 |
| | Partial Dual Diagonal | High code rate LDPC encoding + (phased SPC encodings + partial accumulation) | 2 | 2 | 3 |

In the present disclosure, it is noted, through an experiment by an applicant of the present disclosure, that the density of "1" in the parity check matrix is lower than that of the conventional diagonal extension. Table 2 below shows measurement results of maximum and average degrees for extension parts of the RC-LDPC code designed through the diagonal extension scheme, the stair-wise extension scheme, and the partial dual diagonal extension scheme. Further, in Table 2 below, it may be noted that the extension schemes are asymptotically optimized at the same level through threshold values showing an asymptotic performance for each code and code rate.

In addition, according to Table 2 below, when the codes are optimized at the same level, the density of "1" in the parity check matrix designed through the stair-wise and partial dual diagonal extension schemes according to the present disclosure is much lower than that designed through the conventional diagonal extension scheme. Accordingly, it may be noted that not only the decoding complexity but also the encoding complexity can be significantly improved.

through an experiment result, that the RC-LDPC code designed according to the present disclosure is more excellent than the conventional diagonal extension scheme and, particularly, a performance difference becomes larger as a code rate is lower.

The new structure of the parity check matrix of the RC-LDPC code according to the present disclosure may organically support transmission of various code rates through one code structure like the parity check matrix according to the conventional diagonal extension scheme and general extension scheme. Further, a degree of a parameter node of a message bit part (information bit part) of the

TABLE 2

| | Diagonal Extension | | | Stair-wise Extension | | | Partial Dual-diagonal Extension | | |
|---|---|---|---|---|---|---|---|---|---|
| | Threshold | | Degrees | Threshold | | Degrees | Threshold | | Degrees |
| 1/3 | 0.01487 | Avg. VNs | 7.1667 | 0.01082 | Avg. VNs | 6.8333 | 0.016859 | Avg. VNs | 6.8333 |
| | | Max. VNs | 14 | | Max. VNs | 12 | | Max. VNs | 12 |
| | | Avg. CNs | 5.3333 | | Avg. CNs | 5 | | Avg. CNs | 5.0833 |
| | | Max. CNs | 6 | | Max. CNs | 5 | | Max. CNs | 6 |
| 1/6 | −0.554598 | Avg. VNs | 13.0833 | −0.555868 | Avg. VNs | 12.5833 | −0.548997 | Avg. VNs | 12.25 |
| | | Max. VNs | 28 | | Max. VNs | 22 | | Max. VNs | 22 |
| | | Avg. CNs | 4.125 | | Avg. CNs | 3.9583 | | Avg. CNs | 3.8333 |
| | | Max. CNs | 5 | | Max. CNs | 4 | | Max. CNs | 4 |
| 1/9 | −0.713603 | Avg. VNs | 18.6667 | −0.713603 | Avg. VNs | 16.75 | −0.711302 | Avg. VNs | 17 |
| | | Max. VNs | 40 | | Max. VNs | 28 | | Max. VNs | 30 |
| | | Avg. CNs | 3.7917 | | Avg. CNs | 3.375 | | Avg. CNs | 3.5 |
| | | Max. CNs | 4 | | Max. CNs | 4 | | Max. CNs | 4 |
| 1/12 | −0.804954 | Avg. VNs | 24.3333 | −0.802418 | Avg. VNs | 20.4167 | −0.802095 | Avg. VNs | 21.3333 |
| | | Max. VNs | 50 | | Max. VNs | 34 | | Max. VNs | 36 |
| | | Avg. CNs | 3.8333 | | Avg. CNs | 3.0417 | | Avg. CNs | 3.25 |
| | | Max. CNs | 4 | | Max. CNs | 4 | | Max. CNs | 4 |
| 1/24 | −0.911918 | Avg. VNs | 45.8333 | −0.924799 | Avg. VNs | 37.75 | −0.911918 | Avg. VNs | 42.6667 |
| | | Max. VNs | 80 | | Max. VNs | 58 | | Max. VNs | 66 |
| | | Avg. CNs | 3.6739 | | Avg. CNs | 3.4479 | | Avg. CNs | 3.7008 |
| | | Max. CNs | 4 | | Max. CNs | 4 | | Max. CNs | 4 |
| 1/48 | −1.03253 | Avg. VNs | 87.1667 | −1.006168 | Avg. VNs | 64.75 | −0.993052 | Avg. VNs | 80 |
| | | Max. VNs | 132 | | Max. VNs | 90 | | Max. VNs | 112 |
| | | Avg. CNs | 3.5833 | | Avg. CNs | 3 | | Avg. CNs | 3.375 |
| | | Max. CNs | 4 | | Max. CNs | 3 | | Max. CNs | 4 |

Figure 11:
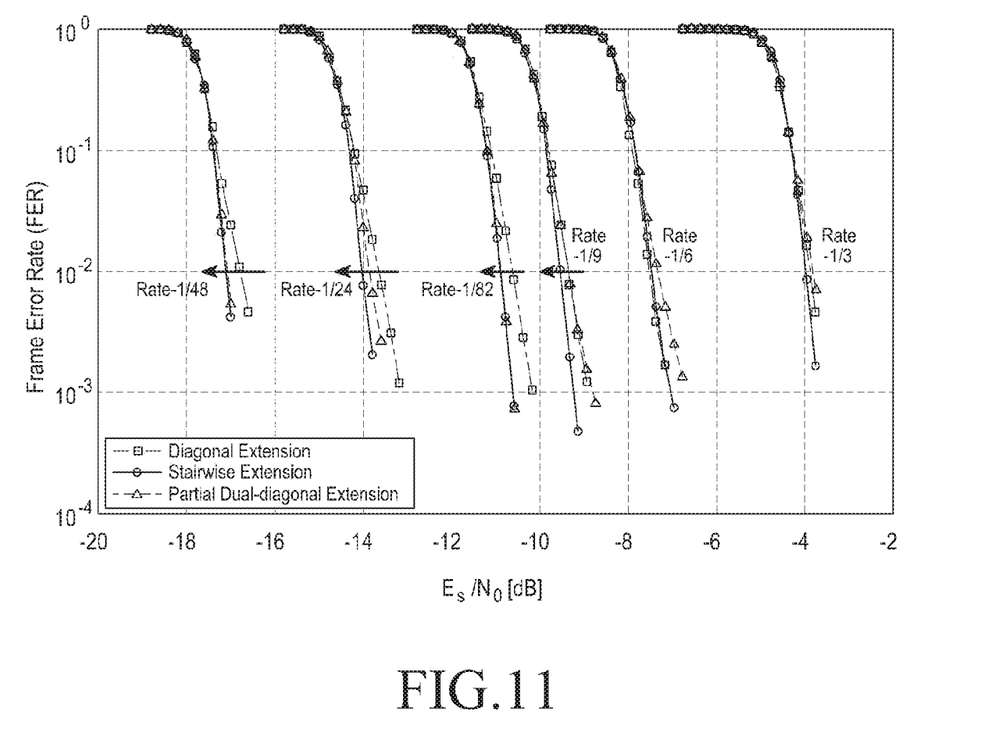
FIG. 11 illustrates an error correction performance of the RC-LDPC code designed through the conventional extension scheme, and the stair-wise extension scheme and the partial dual diagonal extension scheme according an embodiment of to the present disclosure.

FIG. 11 illustrates an actual experiment result showing an error correction performance of the RC-LDPC code designed through the conventional extension scheme, and the stair-wise extension scheme and the partial dual diagonal extension scheme according to the present disclosure. Under experiment conditions of FIG. 11, a message length corresponds to 800 bits and a codeword encoded by each code is BPSK-modulated and transmitted to a binary additive white Gaussian noise (AWGN) channel, and it may be noted, parity check matrix according to the present disclosure is reduced compared to the conventional extension scheme and general extension scheme, so that the encoding and decoding complexity can be reduced. In addition, a parity bit part of the parity check matrix according to the present disclosure is designed to have an implementation-friendly structure and thus an efficient encoding is possible.

While the present disclosure has been shown and described with reference to various embodiments thereof, it will be understood by those skilled in the art that various changes in form and details may be made therein without departing from the spirit and scope of the present disclosure as defined by the appended claims and their equivalents.

The invention claimed is:

1. A method of encoding using a low density parity check (LDPC) code in a communication system, the method comprising:
   inputting information bits for data transmission;
   generating parity bits by LDPC encoding the information bits based on a parity-check matrix consisting of a first sub-matrix having a first code rate and a second sub-matrix having a second code for code extension, wherein the second sub-matrix has a stair-wise lower triangular structure in an extension part; and
   outputting the information bits and the generated parity bits.

2. The method of claim 1,
   wherein the second sub-matrix comprises a stair-wise diagonal matrix in the extension part, and
   wherein a location of "1" in the extension part is restrictively set.

3. The method of claim 1, wherein the second sub-matrix is configured according to each code rate in a unit of modulation and coding schemes (MCSs).

4. An encoding apparatus using a low density parity check (LDPC) code in a communication system, the encoding apparatus comprising:
   an LDPC encoder configured to:
      input information bits for data transmission,
      generate parity bits by LDPC encoding the information bits based on a parity-check matrix consisting of a first sub-matrix having a first code rate and a second sub-matrix having a second code for code extension, wherein the second sub-matrix has a stair-wise lower triangular structure in an extension part, and
      output the information bits and the generated parity bits.

5. A method of encoding using a low density parity check (LDPC) code in a communication system, the method comprising:
   inputting information bits for data transmission;
   generating parity bits by LDPC encoding the information bits based on a parity-check matrix consisting of a first sub-matrix for a first code rate and a second sub-matrix for a second code rate for code extension, wherein the second sub-matrix has a partial dual diagonal structure in an extension part;
   performing a partial accumulation on the generated parity bits based on a second diagonal component in the extension part; and
   outputting the information bits and the partial accumulated parity bits.

6. The method of claim 5, wherein the second sub-matrix is configured according to each code rate in a unit of modulation and coding schemes (MCSs).

7. An encoding apparatus using a low density parity check (LDPC) code in a communication system, the encoding apparatus comprising:
   an LDPC encoder configured to:
      input information bits for data transmission,
      generate parity bits by LDPC encoding the information bits based on a parity-check matrix consisting of a first sub-matrix for a first code rate and a second sub-matrix for a second code rate for code extension, wherein the second sub-matrix has a partial dual diagonal structure in an extension part,
      perform a partial accumulation on the generated parity bits based on a second diagonal component in the extension part, and
      output the information bits and the generated parity bits.

8. The encoding apparatus of claim 4,
   wherein the second sub-matrix comprises a stair-wise diagonal matrix in the extension part, and
   wherein a location of "1" in the extension part is restrictively set.

9. The encoding apparatus of claim 4, wherein the second sub-matrix is configured according to each code rate in a unit of modulation and coding schemes (MCSs).

10. The encoding apparatus of claim 7, wherein the second sub-matrix is configured according to each code rate in a unit of modulation and coding schemes (MCSs).

* * * * *